United States Patent
Burggraf et al.

(10) Patent No.: US 9,449,863 B2
(45) Date of Patent: Sep. 20, 2016

(54) DEVICE FOR ALIGNING AND PRE-FIXING A WAFER

(71) Applicant: EV Group GmbH, St. Florian am Inn (AT)

(72) Inventors: Jurgen Burggraf, Scharding/Inn (AT); Friedrich Paul Lindner, Scharding (AT); Stefan Pargfrieder, Reichenau (AT); Daniel Burgstaller, Neuhofen/Innkreis (AT)

(73) Assignee: EV Group GmbH, St. Florian am Inn (AT)

( * ) Notice: Subject to any disclaimer, the term of this patent is extended or adjusted under 35 U.S.C. 154(b) by 0 days.

(21) Appl. No.: 14/537,066

(22) Filed: Nov. 10, 2014

(65) Prior Publication Data

US 2015/0089783 A1  Apr. 2, 2015

Related U.S. Application Data

(62) Division of application No. 13/138,906, filed as application No. PCT/EP2010/002053 on Mar. 31, 2010, now Pat. No. 8,918,989.

(30) Foreign Application Priority Data

Apr. 25, 2009 (DE) .................. 10 2009 018 977

(51) Int. Cl.
  *H01L 21/68* (2006.01)
  *H01L 21/67* (2006.01)
  *H01L 21/687* (2006.01)

(52) U.S. Cl.
  CPC ......... *H01L 21/68* (2013.01); *H01L 21/67132* (2013.01); *H01L 21/68728* (2013.01); *Y10T 29/4913* (2015.01); *Y10T 29/49131* (2015.01); *Y10T 29/49133* (2015.01);
  (Continued)

(58) Field of Classification Search
  CPC ............. H01L 21/67132; H01L 21/68; H01L 21/68728
  See application file for complete search history.

(56) References Cited

U.S. PATENT DOCUMENTS 4,915,565 A  4/1990  Bond et al. ..................... 29/740
5,194,743 A  3/1993  Aoyama et al. ............... 250/548
(Continued)

FOREIGN PATENT DOCUMENTS

CN  1536638     10/2004  ............. G03F 7/20
EP  1450398 A1  2/2004   ............. H01L 21/68
(Continued)

OTHER PUBLICATIONS

Office Action issued in connection with European Patent Application No. 10 712 900.9, mailed Oct. 24, 2014.
(Continued)

*Primary Examiner* — Minh Trinh
(74) *Attorney, Agent, or Firm* — Kusner & Jaffe

(57) ABSTRACT

A device for aligning and prefixing a flat substrate on a carrier substrate for the further processing of the substrate. The device includes aligning means for aligning a substrate's outside contour relative to a carrier substrate's outside contour by engaging the substrate's outside contour. The alignment of the substrate is carried out along a substrate plane E that is parallel to a contact surface of the substrate. Attaching means is provided for at least partial prefixing of the aligned substrate on the carrier substrate.

10 Claims, 2 Drawing Sheets

(52) U.S. Cl.
CPC .... *Y10T 29/49902* (2015.01); *Y10T 29/53091* (2015.01); *Y10T 29/53174* (2015.01); *Y10T 29/53978* (2015.01)

(56) References Cited

U.S. PATENT DOCUMENTS

| | | | |
|---|---|---|---|
| 5,870,488 A | 2/1999 | Rush et al. .................... | 382/151 |
| 5,959,721 A | 9/1999 | Nishi .............................. | 355/53 |
| 6,811,370 B2 | 11/2004 | Buermann ................ | 414/416.03 |
| 8,918,989 B2 * | 12/2014 | Burggraf ........... | H01L 21/67132 29/721 |
| 2005/0160992 A1 | 7/2005 | Sundar .......................... | 118/729 |
| 2012/0110825 A1 | 5/2012 | Burggraf et al. ................ | 29/468 |

FOREIGN PATENT DOCUMENTS

| | | | | |
|---|---|---|---|---|
| EP | 1458013 A1 | 9/2004 | ............. | H01L 21/00 |
| JP | 04-149917 | 5/1992 | ............. | H01B 19/00 |
| JP | H04149917 | 5/1992 | ............. | H01B 19/00 |
| JP | 3227702 | 11/2001 | ............. | H01B 19/00 |
| JP | 2002-313688 | 10/2002 | ............. | H01L 21/02 |
| JP | 2004-207436 | 7/2004 | ............. | H01L 21/02 |
| JP | 2004-253808 | 9/2004 | ............. | H01L 21/68 |
| JP | 2004-296907 | 10/2004 | ............. | H01L 21/02 |
| JP | 2005-039035 | 2/2005 | ............. | H01L 21/68 |
| JP | 2008-182127 | 8/2008 | ........... | H01L 21/683 |

OTHER PUBLICATIONS

International Search Report from corresponding International Application No. PCT/EP2010/002053.

Office Action received in corresponding Japanese Patent Application No. 2012-506360, issued on Mar. 26, 2013 (English-language translation provided).

Notice of Reasons for Rejections from corresponding Japanese Patent Application No. 2012-506360, mailed Oct. 8, 2013 (English-language translation provided).

Office Action received in corresponding Chinese Patent Application No. CN 201080019365.9, dated Nov. 22, 2013 (English-language translation of the *Relevant Patent Documents* section provided).

Office Action received in corresponding Korean Patent Application No. 10-2011-7025193 dated Jan. 19, 2016.

* cited by examiner

DEVICE FOR ALIGNING AND PRE-FIXING A WAFER

RELATED APPLICATIONS

This application is a divisional of U.S. application Ser. No. 13/138,906, filed Dec. 9, 2011, which is the U.S. National Stage of International Application No. PCT/EP2010/002053, filed Mar. 31, 2010, which claims priority from German Patent Application No. 10 2009 018977.7, filed Apr. 25, 2009, said patent applications hereby fully incorporated herein by reference.

FIELD OF THE INVENTION

The invention relates to a device for aligning and prefixing a flat substrate on a carrier substrate for the further processing of the substrate.

BACKGROUND OF THE INVENTION

To be able to produce very thin substrates, in particular semiconductor substrates such as wafers with a thickness of a few nm up to 250 µm, the latter are usually mounted on carrier systems. Starting from a thick (usually greater than 250 µm) substrate, in most cases a carrier foil is laminated on one side (so-called "back-thinning tape") in order to be able to subsequently back-thin the substrate.

The back-thinning of wafers is often necessary in the semiconductor industry and can be implemented mechanically and/or chemically. For back-thinning, the wafers are generally temporarily attached to a carrier, whereby there are various methods for attachment. As carrier material, for example, foils, glass substrates or silicon wafers are used. At the end of the back-thinning process and the reworking within a unit, the back-thinned substrates are mounted on film frames, and then the carrier material is removed.

As soon as a working of the substrate that goes beyond the back-thinning is necessary, rigid carrier systems are used. Examples of such working steps on processing units after back-thinning are: metallization, dry etching, wet etching, laser processing, lithography, doping, etc.

In rigid carrier systems, the substrate that is to be worked is connected to a carrier substrate by an adhesive layer. The carrier substrate is typically between 250 and 1,500 µm thick.

The carrier substrate is to impart adequate mechanical stability to the substrate to be worked to any thinness in order to be able to be worked in related process steps or process units. The selection of the carrier substrate as well as the adhesive depends on the requirements of the subsequent working steps. In particular, the maximum operating temperature, vacuum resistance, optical transparency, chemical resistance, as well as the capacity to offset rough spots are to be considered.

The purpose of such carrier systems consists in being able to further work the thin substrates on mechanically stable carrier substrates in standard units or standard processes, without damaging the thin substrates in the further working, or to develop costly units that are specifically set up for the thin substrates.

Even during transport of the thin substrates from one unit to the next, protection of the to some extent already worked substrates is important to prevent damage to the fragile substrates.

Some of the above-mentioned working steps require an exact positioning of the substrate or the carrier within the corresponding unit, for example under a microscope with high magnification. There, the substrate has to be positioned within one µm to make possible a quick further working/inspection. If the position of the substrate that is to be detected after the positioning is not in the field of vision of the microscope, a search routine or a readjustment is necessary, by which the productivity drops. The positioning is carried out, for example, on the outside contour of the substrate or carrier, for example a flattened surface (so-called "flat") or a recess (so-called "notch").

It is therefore often necessary that in the carrier systems, positioning of the substrate is performed based on the outside control of the carrier so that as exact a positioning of the substrate as possible on the carrier is desirable.

Since the outside contours of the substrates or carrier substrates are associated with to some extent considerable manufacturing tolerances, positioning with simple mechanical stops is not adequate for a µm-precision positioning. Very narrowly tolerated substrate dimensions were no longer economical with a considerable additional expenditure in the production. Also, application of optically detectable passmarks increases the cost of the carrier system and is not possible in all cases.

SUMMARY OF THE INVENTION

It is therefore the object of this invention to indicate a device and a corresponding process with which an exact positioning of a flat substrate that is attached to a carrier substrate is made possible and that simultaneously can be used universally.

In accordance with the present invention, there is provided a device for aligning and prefixing a flat substrate on a carrier substrate for the further processing of the substrate. The device for aligning is comprised of:

aligning means for aligning an outside contour of the substrate relative to an outside contour of the carrier substrate by action on the outside contour of the substrate, whereby the orientation along a substrate plane E that is formed with the carrier substrate is carried out by a contact surface of the substrate, and attaching means for at least partial prefixing of the oriented substrate on the carrier substrate.

In accordance with another aspect of the present invention, there is provided a process for aligning and prefixing a flat substrate on a carrier substrate for the further processing of the substrate, comprised of the following steps:

aligning an outside contour of the substrate relative to an outside contour of the carrier substrate by action on the outside contour of the substrate by aligning means, whereby the orientation along a substrate plane E that is formed by a contact surface of the substrate is carried out, and at least partially prefixing the oriented substrate on the carrier substrate by attaching means.

Advantageous further developments of the invention are indicated in the subclaims. Within the scope of the invention, all combinations also consist of at least two of the features that are indicated in the specification, the claims and/or the figures. In the indicated ranges of values, values that lie within the above-mentioned limits are also to be considered as disclosed and can be claimed in any combination.

The invention is based on the idea of improving a generic device as well as a generic process in such a way that the orientation of the substrate and carrier substrate, in particular suitable for the further processing, is carried out based on the outside contour or the periphery of the substrate and the carrier substrate. In addition, fasteners according to the invention are provided for at least partial prefixing of the oriented substrate to the carrier substrate. The orientation is preferably carried out without optical adjuvants, in particular by using mechanical aligning means. The use of a movable mechanism, preferably a movable mechanism both for the orientation of the substrate and for the orientation of the carrier substrate, is especially preferred. In this case, it is especially advantageous if the aligning means are arranged in their own unit, in particular separated from a unit for bonding the substrate. This invention therefore relates to a device and a process with which two substrates, namely a substrate and a carrier substrate, can be adjusted or oriented exactly with respect to one another mechanically or independently of dimensions that are subject to manufacturing tolerances.

The carrier substrate is used as a mechanical stabilizer. The carrier substrate imparts sufficient mechanical stiffness to the composite that consists of substrate and carrier substrate to make possible a processing of the thin substrate that is as non-destructive as possible. The dimensions of the substrate are advantageously equal to or slightly smaller than the carrier substrate, for example in a diameter of the carrier substrate of 200.0 mm, a diameter of the substrate of 199.6 mm.

As a substrate, for example, wafers are suitable that can be round or rectangular, with or without flats or notches.

In one advantageous embodiment in the invention, it is provided that the aligning means are designed to act especially exclusively in the radial direction R of the substrate and/or the carrier substrate.

As an alternative, the aligning means can be designed to act especially exclusively crosswise to the substrate's outside contour and/or to the carrier substrate's outside contour. In this way, a flexible and universal orientation of the substrate is possible with the carrier substrate and/or the receiving device.

According to another advantageous embodiment of the invention, the aligning means comprise at least three E-actuators that can be arranged distributed onto the substrate's outside contour for aligning the substrate as well as position-detecting means for detecting the position of the E-actuators. The use of actuators provides the advantage that a high-precision control, in particular path- and/or force-dependent, can be performed in the orientation of the substrate and/or the carrier substrate in the substrate plane E.

Advantageously, the E-actuators are designed to move along or parallel to the substrate plane E and orthogonal to the substrate's outside contour. Orthogonal to the substrate's outside contour means that the direction of movement of each E-actuator is orthogonal to the tangent that runs at the closest point of the substrate's outside contour or carrier substrate's outside contour. In the case of a rectangular substrate, the side of the substrate is considered the tangent, and the direction of movement of the E-actuator intersects the side of the substrate or the carrier substrate as much in the middle as possible. Several E-actuators can be provided per side, however.

If the carrier substrate's outside contour corresponds to the substrate's outside contour or the latter rises above the entire periphery of the carrier substrate's outside contour, the carrier substrate offers excellent protection for the substrate in the further processing and/or movement of the composite that consists of the carrier substrate and substrate.

By the attaching means comprising at least one attaching actuator, which is designed to act in the Z-direction, arranged crosswise, in particular orthogonally, to the substrate plane E, attachment can also take place with the advantages, mentioned above with regard to actuators, of force- and/or path control in a defined manner.

According to another embodiment of the invention, it is advantageously provided that spacing means are provided to maintain a distance between the substrate and carrier substrate when aligning the wafers. In this respect, the substrate is preserved when aligning the wafer. As spacing means, wedges are provided that are advantageously pushed in laterally between substrate and carrier substrate, in particular cone wedges. The wedges can be run into the corresponding spacing position by actuators.

In addition, it is advantageously provided that the aligning means comprise Z-actuators for moving the E-actuators crosswise to the substrate plane E, in particular in the Z direction. In this way, the E-actuators can be oriented exactly relative to the substrate. In addition, the advantage exists that with the E-actuators, both the substrate and the carrier substrate can be oriented after one another, According to one advantageous embodiment, the attaching means comprise energy-inserting means for, in particular, local application preferably at points of the substrate and/or carrier substrate with energy to the attachment of substrate and carrier substrate. In this respect, the clamping attachment of substrate and carrier substrate or additional components for attaching the substrate to the carrier substrate can be dispensed with. At the same time, however, an attachment that is sufficient for the further processing is achieved.

In this case, it is especially advantageous when the energy-inserting means are formed by the attaching actuator, or a light source or a heating means is provided as an energy-inserting means.

The process according to the invention is improved by spacing means being provided during the orientation for maintaining a distance between substrate and carrier substrate when the wafers are oriented.

BRIEF DESCRIPTION OF THE DRAWINGS

Other advantages, features, and details of the invention will emerge from the following description of preferred embodiments as well as based on the drawings; these are shown in.

DETAILED DESCRIPTION OF PREFERRED EMBODIMENTS

In the figures, the same components and components with the same function are identified with the same reference numbers.

Figure 1:
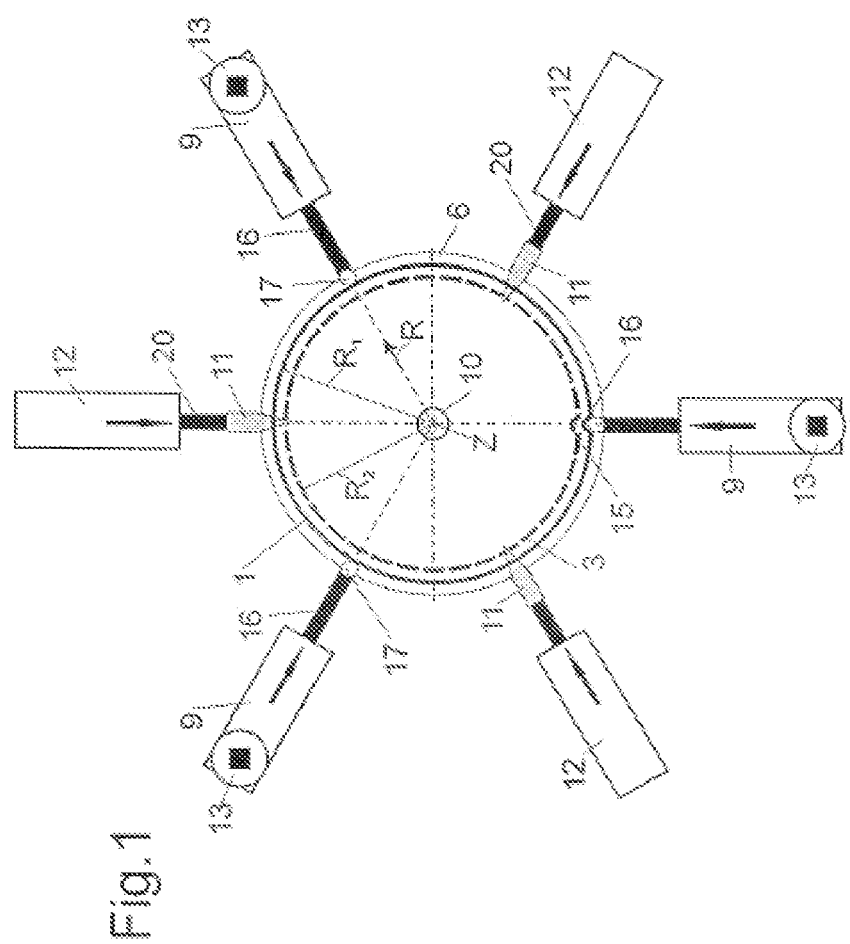
FIG. 1: A diagrammatic overview of the device according to the invention.

In FIG. 1, a substrate 3 (broken lines) is positioned on a receiving device 6 (here: a chuck), and a carrier substrate 1 is positioned above the substrate 3, and said carrier substrate 1 has a larger radius R1 than the radius R2 of the substrate 3.

Both the substrate 3 and the carrier substrate 1 have one nose 14, 15 (notch) each on the periphery, which is used for rotationally correct orientation of the substrate 3 and the carrier substrate 1. The positioning of the substrate 3 and the carrier substrate 1 is carried out sequentially in the embodiment shown here. In the diagrammatic representation that is shown, the positioning or orientation of the carrier substrate 1 takes place while the positioning or orientation of the substrate 3 has already been performed.

The orientation of the carrier substrate 1 is achieved by three E-actuators 9 distributed on the periphery. One of the E-actuators 9, in the embodiment of the E-actuator 9 shown below in FIG. 1, is used at the same time for exact orientation of the noses 14 and 15.

The E-actuators 9 consist of an actuator arm 16, which has an actuator arm end 17 designed to make contact with an outside contour of the carrier substrate 1.

In the embodiment that is shown, three E-actuators 9 are arranged distributed uniformly on the periphery of the round carrier substrate 1. The movement of the actuator arm 16 is based on position, whereby the force applied to each actuator arm 16 can advantageously be adjusted and/or measured. In addition, a path-measuring system can advantageously be provided in each E-actuator 9. The movement of each actuator arm 16 is carried out crosswise to the outside contour of the carrier substrate 1, in the case of the round carrier substrate 1 that is shown in FIG. 1 in a radial direction R.

Each of the E-actuators 9 moves the carrier substrate 1 in the direction of a center Z, primarily in a substrate plane E or parallel thereto.

In addition, wedge actuators 12 are arranged distributed on the periphery of the carrier substrate 1, namely offset to the E-actuators 9. In the embodiment that is shown, in each case three wedge actuators 12 and three E-actuators 9 are arranged.

Wedges 11 are applied to wedge actuator arms 20 of the wedge actuators 12, and said wedges are used as spacing means during the orientation of the carrier substrate 1, shown in FIG. 1, relative to the substrate 3. The function of the wedge 11 as a spacing means is readily recognizable in FIG. 2.

Figure 2:
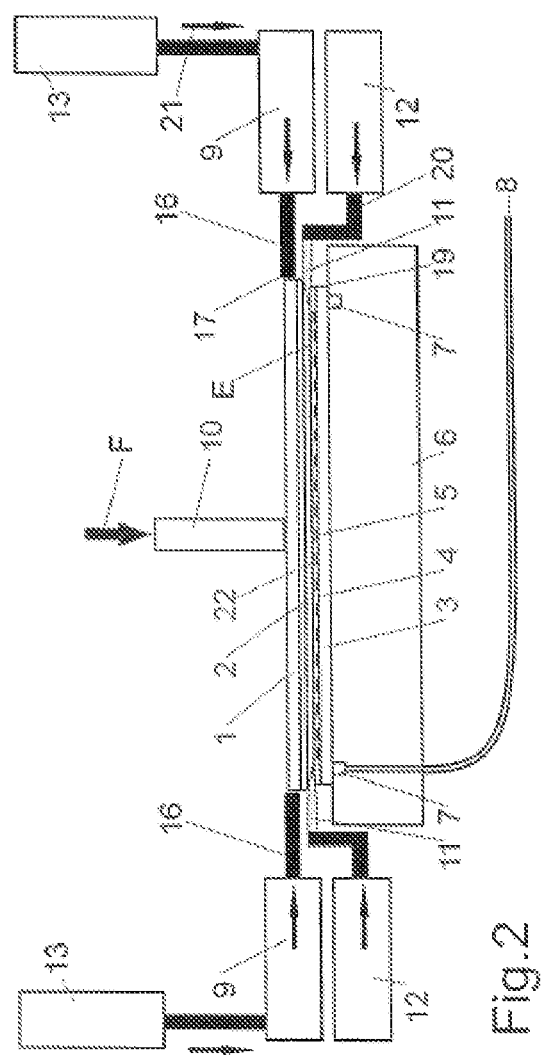
FIG. 2: A diagrammatic side view of the device according to the invention.

In FIG. 2, moreover, it is recognizable how the substrate 3 is arranged in an attachable manner to the receiving device 6, namely by a vacuum device, not shown, whereby the vacuum or the underpressure can be subjected to pressure over a line 8 and a recess 7 that is introduced into a receiving surface for receiving the substrate 3 in the receiving device 6.

During the aligning process of the substrate 3, the vacuum device can be used simultaneously as an air cushion with the line 8 and the recess 7 by an overpressure or an air stream being applied to the receiving surface as an air cushion via the line 8 and the recess 7. In this way, an almost friction-free orientation of the substrate 3 on the receiving device 6 is possible. In an alternative embodiment, instead of or in addition to the vacuum device, the receiving device 6 can integrate an attachment that is electrostatic, magnetic and/or acts by gravity with the line 8 and the recess 7.

The orientation of the substrate 3 is carried out analogously to the orientation of the carrier substrate 1, which was described above. For orientation of the substrate 3, the E-actuators 9 are moved by Z-actuators 13 that are applied to the E-actuators 9 in a Z-direction that is shown by arrow 21, so that the actuator arm 16 or the actuator arm end 17 can rest on a substrate's outside contour 19 in order to produce the orientation of the substrate 3.

The position of the E-actuators 9 that is shown in FIG. 2 above the wedge actuators 12 is purely diagrammatical, since the E-actuators 9 are in actuality arranged offset to the wedge actuators 12 according to FIG. 1. The representation that is shown is used for easier understanding of the function of the device according to the invention.

For attaching the oriented substrate 3 to the oriented carrier substrate 1 in the center Z, an attaching actuator 10 that acts in the attaching direction F is arranged above the carrier substrate 1. The attaching actuator 10 is based on force and is used for local energy input. The type of energy input depends on the material of a connecting means 2 on the carrier substrate 1 or connecting means 4 on the substrate 3. The connecting means 2, 4 can be designed as thermally activated or UV-activated or infrared-activated adhesive or as a self-adhering layer.

In addition, the substrate 3 can have a topography 5.

The course of the orientation and prefixing is as follows:

First, the substrate is loaded manually or via a robot arm, not shown, onto the receiving device 6. If the carrier substrate 1 should be below, the carrier substrate 1 is loaded first. Subsequently, however, the process starts from the embodiment that is shown in the figures.

The E-actuators 9 are run by the Z-actuators 13 on the level of the substrate 3.

Subsequently or simultaneously, overpressure on the air cushion formed by the recesses 7 can be switched on via the line 8, so that the substrate 3 can be oriented and centered essentially friction-free.

The E-actuators 9 are moved essentially symmetrically in the direction of the center Z until all E-actuators are automatically stopped because of their force adjustment. The substrate 3 at this time is in a preferably centered position that is defined relative to the receiving device 6.

In this position, the substrate 3 is attached via the line 8 by applying a vacuum to the recesses 7.

The positions of each of the E-actuators 9 are stored, so that in the embodiment shown in the figures, three path positions and thus the exact position of the substrate 3 are stored.

If an orientation of the carrier substrate 1 relative to the substrate 3 is to take place at a distance, the wedges 11 are run in as spacers by means of the wedge actuators 12 that are distributed on the periphery, so that three wedges 11, which are preferably designed wedge-shaped, are arranged on the periphery of the carrier substrate 1 between carrier substrate 1 and substrate 3 and ensure a distance between carrier substrate 1 and substrate 3.

Then, the carrier substrate 1 is loaded on the substrate 3 or the wedge 11. At the same time or subsequently, the E-actuators 9 are brought by means of the Z-actuators 13 to the level of the carrier substrate 1. Analogously to the orientation of the substrate 3, the orientation of the carrier substrate 1 is now carried out symmetrically and equisdistant to the positions stored for the substrate 3. As soon as the carrier substrate 1 is oriented relative to the substrate 3, point energy (here in center Z) is applied by the attaching actuator 10 to the carrier substrate 1, and the carrier substrate is bonded and prefixed to the substrate 3.

The prefixing can take place either in the presence of wedges 11 or with wedges 11 pulled out, whereby the carrier substrate 1 will warp in the center during prefixing with the wedges 11 run in.

After the adhesive action of the connecting means 2 and/or the connecting means 4 has occurred at a point, the attaching actuator 10 departs upward. Then, the wedges 11 are run out over the wedge actuators 12, and the E-actuators are run back. The substrate 3 and the carrier substrate 1 are now in contact along a contact surface 22 of the substrate 3.

After the vacuum 7 is released, the composite that consists of carrier substrate 1 and substrate 3 can be unloaded for further processing in additional process steps/units, for example with a robot arm.

Having described the invention, the following is claimed:

1. Device for aligning and prefixing a flat substrate on a carrier substrate for the further processing of the substrate, the device including:
   at least one aligning actuator having a single actuator arm, the single actuator arm oriented toward a center of the carrier substrate wherein the single actuator arm engages an outside contour of the flat substrate and/or an outside contour of the carrier substrate to move the flat substrate and/or the carrier substrate along a plane parallel to a contact surface of the flat substrate; and
   at least one attaching actuator engaging the flat substrate and/or the carrier substrate to at least partially prefix the flat substrate and the carrier substrate together,
   wherein the at least one attaching actuator includes energy-inserting means for local application of the flat substrate and/or the carrier substrate with energy for the prefixing of the flat substrate and the carrier substrate together.

2. The device according to claim 1, wherein the single actuator arm of the at least one aligning actuator is oriented in the radial direction R of the flat substrate and/or the carrier substrate.

3. The device according to claim 1, wherein the single actuator arm of the at least one aligning actuator is oriented crosswise to the outside contour of the flat substrate and/or to the outside contour of the carrier substrate.

4. The device according to claim 1, wherein the device further includes:
   at least three aligning actuators that are distributed around the outside contour of the flat substrate for aligning the flat substrate, and
   position-detecting means for detecting the position of the at least three aligning actuators.

5. The device according to claim 4, wherein the at least three aligning actuators are oriented in a direction parallel to the contact surface of the flat substrate and orthogonally to the outside contour of the flat substrate.

6. The device according to claim 1, wherein the outside contour of the carrier substrate corresponds to the outside contour of the flat substrate.

7. The device according to claim 1, wherein the at least one attaching actuator is oriented in a direction generally orthogonal to the contact surface of the flat substrate.

8. The device according to claim 1, wherein the device further includes:
   spacing means for maintaining a distance between the contact surface of the flat substrate and the carrier substrate when the carrier substrate is aligned with the flat substrate.

9. The device according to claim 1, wherein the device further includes:
   at least one Z-actuator for moving the at least one aligning actuator in the direction generally perpendicular to the contact surface of the flat substrate.

10. The device according to claim 1, wherein the energy-inserting means are formed by the at least one attaching actuator and/or by a light source and/or by a heating means.

* * * * *